United States Patent
Kim et al.

(10) Patent No.: US 7,352,037 B2
(45) Date of Patent: Apr. 1, 2008

(54) SEMICONDUCTOR DEVICE AND RANDOM ACCESS MEMORY HAVING SINGLE GATE ELECTRODE CORRESPONDING TO A PAIR OF CHANNEL REGIONS

(75) Inventors: Won-joo Kim, Suwon-si (KR); Suk-pil Kim, Yongin-si (KR); Yoon-dong Park, Yongin-si (KR); Eun-Hong Lee, Anyang-si (KR); Jae-woong Hyun, Uijeongbu-si (KR); Jung-hoon Lee, Seoul (KR); Sung-jae Byun, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 160 days.

(21) Appl. No.: 11/393,750

(22) Filed: Mar. 31, 2006

(65) Prior Publication Data
US 2007/0019479 A1 Jan. 25, 2007

(30) Foreign Application Priority Data
Jul. 22, 2005 (KR) .................... 10-2005-0066989

(51) Int. Cl.
*H01L 29/94* (2006.01)

(52) U.S. Cl. .................. 257/401; 257/618; 257/327; 257/347; 257/E29.275; 257/E29.137

(58) Field of Classification Search ............. 257/401, 257/E29.275
See application file for complete search history.

(56) References Cited

U.S. PATENT DOCUMENTS 7,122,871 B2 * 10/2006 Lee et al. .................. 257/412

* cited by examiner

*Primary Examiner*—Tu-Tu Ho
(74) *Attorney, Agent, or Firm*—Harness, Dickey & Pierce, P.L.C.

(57) ABSTRACT

A semiconductor device may include at least one pair of fins on a semiconductor substrate. A channel region may be formed in each fin. The semiconductor device may further include a gate electrode corresponding to each pair of channel regions, a source contact plug electrically connected to each of at least one source formed on a respective fin concurrently, and a drain contact plug electrically connected to each of at least one drain formed on a respective fin concurrently.

21 Claims, 8 Drawing Sheets

SEMICONDUCTOR DEVICE AND RANDOM ACCESS MEMORY HAVING SINGLE GATE ELECTRODE CORRESPONDING TO A PAIR OF CHANNEL REGIONS

PRIORITY STATEMENT

This patent application claims priority under 35 U.S.C. § 119 to Korean Patent Application No. 10-2005-0066989, filed on Jul. 22, 2005, in the Korean Intellectual Property Office (KIPO), the entire contents of which are incorporated herein by reference.

BACKGROUND OF THE INVENTION

1. Field of the Invention

Example embodiments of the present invention relate to semiconductor devices, for example, semiconductor devices and/or random access memories (RAMS) having a fin-type channel region. For example, semiconductor devices according to at least one example embodiment of the present invention may include a FinFET, and a RAM according to at least one example embodiment of the present invention may include a DRAM, an RRAM, a FeRAM and/or a NOR-type flash memory.

2. Description of the Related Art

FinFETs may use an upper surface and side surfaces of a fin as a channel region. Therefore, FinFETs may have a channel area wider than that of a planar-type transistor and may provide increased current flow. As a result, the FinFET may provide higher performance as compared to planar-type related art transistors.

However, related art FinFET are fabricated using, for example, an SOI substrate, and the fin may float from a substrate body. The floating fin may increase the difficulty of controlling a threshold voltage of a transistor using body-bias and/or controlling a threshold voltage of a CMOS transistor. As a drain depletion region is expanded using a related art bulk substrate, a junction leakage current, an off-current and/or a junction capacitance may be increased. A threshold voltage may be reduced in more highly-integrated devices using a short channel effect; however, this may increase off-current.

Related art FinFETs may also have a higher contact resistance. For example, a related art FinFET may include bit line contacts formed to run across fins. In this example, because the bit line contacts and the narrow surfaces of the fins are in contact, a bit line contact resistance may increase. Furthermore, fabrication may be more difficult because the fins may be bent when forming the bit line contacts.

According to the related art, source and drain regions may be formed to connect to fins and/or formed wider to help ensure a contact area. However, a distance between the fins may become wider due to the source and drain regions, and integration density of a FinFET may be reduced.

SUMMARY OF THE INVENTION

Example embodiments of the present invention provide semiconductor devices, which may use an SOI structure while controlling a body-bias and/or having higher performance, higher operating current and/or lower contact resistance. Example embodiments of the present invention may also provide random access memories (RAMs) using the same.

According to an example embodiment of the present invention, a semiconductor device may include a semiconductor substrate, at least one source, at least one drain, a channel region, a gate electrode, at least one source contact plug and at least one drain contact plug. The semiconductor substrate may include a body and at least one pair of fins spaced from each other and protruding from the body. The at least one source and at least one drain may be formed in each fin of the at least one pair of fins, and within each fin the at least one source may be spaced apart from a corresponding drain along the direction in which the pair of fins extends. The channel region may be formed at least near the surfaces of an inner side of each fin, each channel region may connect a corresponding one of the at least one sources to a corresponding one of the at least one drains. The gate electrode may include a first portion arranged between the channel regions formed at least near the inner sides of each fin, and may be insulated from the semiconductor substrate. The at least one source contact plug may be insulated from the body and electrically connected to the at least one sources on each fin concurrently. The at least one drain contact plug may be insulated from the body and electrically connected to the at least one drains on each fin concurrently.

In another example embodiment of the present invention, a random access memory may include at least one unit cell. Each of the at least one unit cell may include at least two semiconductor devices and a storage node. Each semiconductor device may include a semiconductor substrate, at least one source, at least two drains, a channel region, a gate electrode, at least one source contact plug, at least one drain contact plug and a storage node. The semiconductor substrate may include a body and at least one pair of fins spaced from each other and protruding from the body. The at least one source and at least one drain may be formed in each fin of the at least one pair of fins, and within each fin the at least one source may be spaced apart from a corresponding drain along the direction in which the pair of fins extends. The channel region may be formed at least near the surfaces of an inner side of each fin, each channel region may connect a corresponding one of the at least one sources to a corresponding one of the at least one drains. The gate electrode may include a first portion arranged between the channel regions formed at least near the inner sides of each fin, and may be insulated from the semiconductor substrate. The at least one source contact plug may be insulated from the body and electrically connected to the at least one sources on each fin concurrently. The at least one drain contact plug may be insulated from the body and electrically connected to the at least one drains on each fin concurrently. Within each fin a source may be interposed between each of at least two drains. The storage node may be interposed between the first portion of each gate electrode corresponding channel region. The storage node may be insulated from each gate electrode and channel region.

In another example embodiment of the present invention, a random access memory may include at least one unit cell. Each of the at least one unit cell may include at least two semiconductor devices and a storage node. Each of the at least two semiconductor devices may include a semiconductor substrate, at least one source, at least two drains, a channel region, a gate electrode, at least one source contact plug, at least one drain contact plug and a storage node corresponding to each of the at least one drain contact plugs. The semiconductor substrate may include a body and at least one pair of fins spaced from each other and protruding from the body. The at least one source and at least one drain may be formed in each fin of the at least one pair of fins, and within each fin the at least one source may be spaced apart from a corresponding drain along the direction in which the pair of fins extends. The channel region may be formed at least near the surfaces of an inner side of each fin, each channel region may connect a corresponding one of the at least one sources to a corresponding one of the at least one drains. The gate electrode may include a first portion arranged between the channel regions formed at least near the inner sides of each fin, and may be insulated from the semiconductor substrate. The at least one source contact plug may be insulated from the body and electrically connected to the at least one sources on each fin concurrently. The at least one drain contact plug may be insulated from the body and electrically connected to the at least one drains on each fin concurrently. A storage node may be formed on each of the at least one drain contact plug.

In example embodiments of the present invention, the at least one source contact plug may include a first portion arranged between the at least one source on each fin, and the at least one drain contact plug may include a first portion arranged between the at least one drain on each fin. The gate electrode may further include a second portion protruding from between the channel regions. The second portion may cover a top portion of the at least one pair of fins and being insulated from the fins. A first insulating layer may cover external sides of the at least one pair of fins. A second insulating layer may be formed between the at least one source contact plug and the body, between the at least one drain contact plug and the body and/or between each gate electrode and the body.

In example embodiments of the present invention, a storage node may be arranged between the first portion of the gate electrode and each channel region. The storage node may be insulated from the gate electrode and each channel region. The storage node may include polysilicon, silicon-germanium, metal dot, silicon dot or a silicon nitride layer.

In example embodiments of the present invention, a storage node may be formed on the at least one drain contact plug or the at least one source contact plug. The storage node may include a dielectric material, a variable resistance material, a phase change material or a ferroelectric material.

BRIEF DESCRIPTION OF THE DRAWINGS

The present invention will become more apparent by describing in detail the example embodiments illustrated in the attached drawings in which.

DETAILED DESCRIPTION OF EXAMPLE EMBODIMENTS OF THE PRESENT INVENTION

Figure 1:
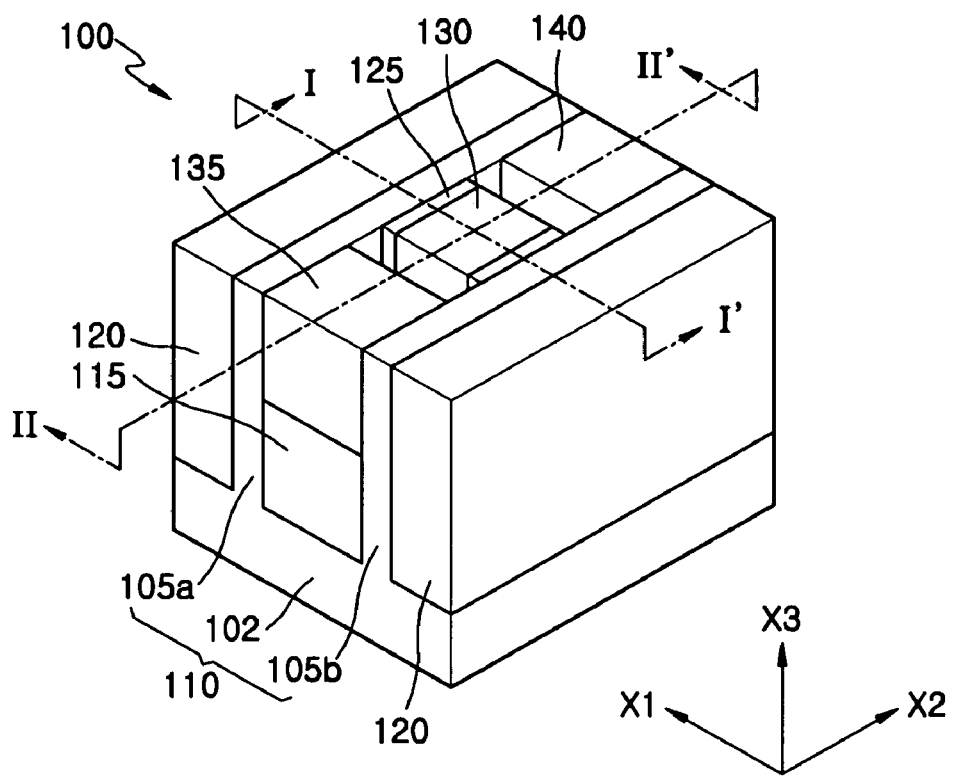
FIG. 1 is a perspective view illustrating a semiconductor device according to an example embodiment of the present invention.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Figure 2A:
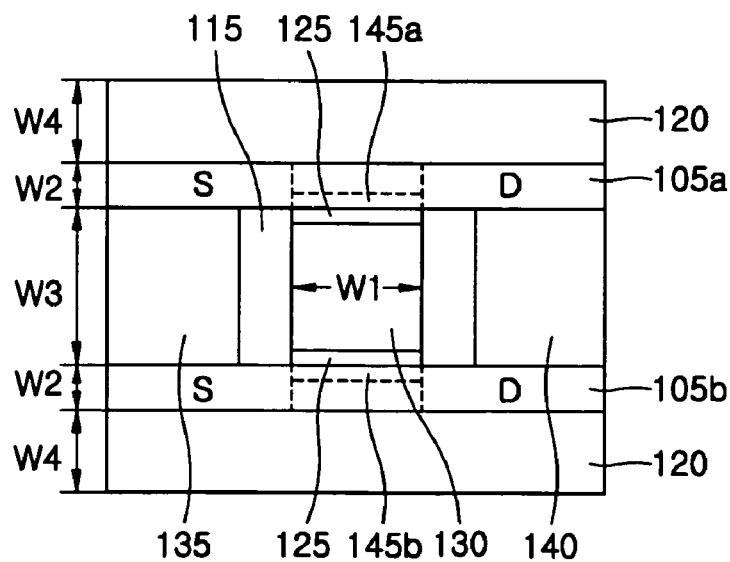
FIG. 2A is a plan view illustrating the semiconductor device of FIG. 1.
Figure 2B:
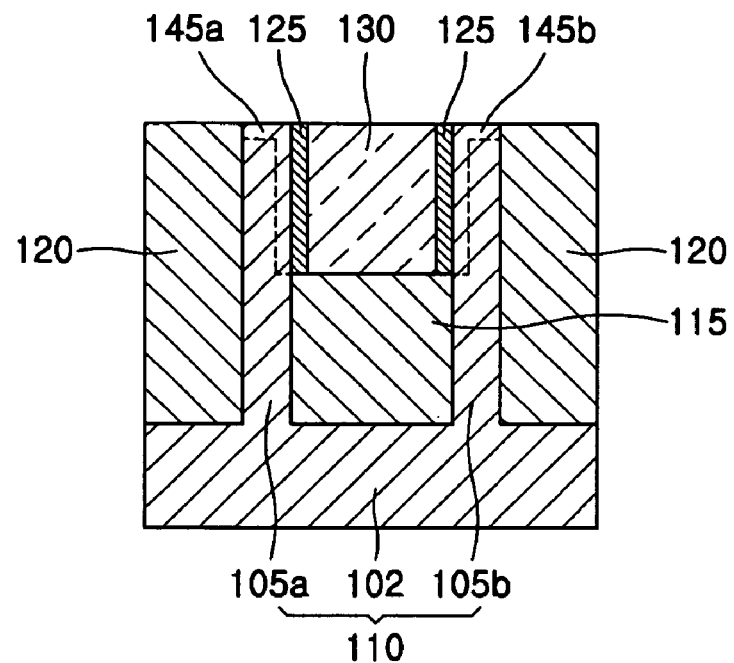
FIG. 2B is a sectional view taken along a line of I-I' of the semiconductor device of FIG. 1.
Figure 2C:
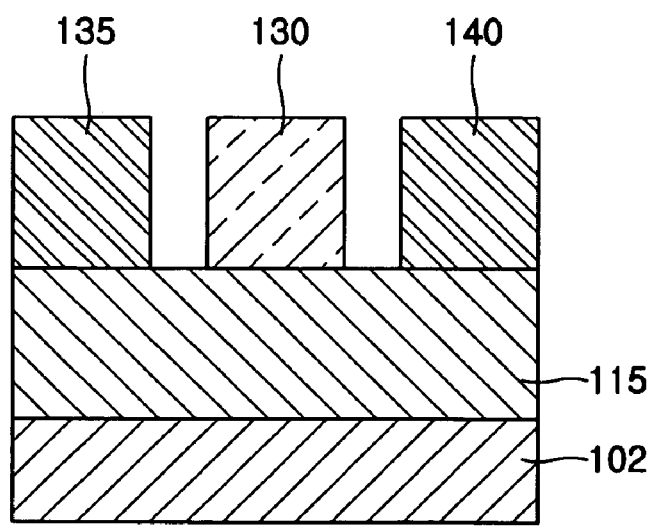
FIG. 2C is a sectional view taken along a line of II-II' of the semiconductor device of FIG. 1.

FIG. 1 is a perspective view illustrating a semiconductor device 100 according to an example embodiment of the present invention, FIG. 2A is a plan view illustrating the semiconductor device 100 of FIG. 1; FIG. 2B is a sectional view taken along a line of I-I' of the semiconductor device 100 of FIG. 1; and FIG. 2C is a sectional view taken along a line of II-II' of the semiconductor device 100 of FIG. 1.

Referring to FIGS. 1 and 2A through 2C, the semiconductor device 100 may include a semiconductor substrate 110. The semiconductor substrate may have a body 102 and a pair of fins 105a, 105b. The semiconductor device may further include a gate electrode 130, interposed between the pair of fins 105a and 105b, a source contact plug 135 and a drain contact plug 140. A pair of channel regions 145a, 145b may be formed at least near the surfaces of the inner sides of the opposing fins 105a, 105b. The gate electrode 130 and the pair of channel regions 145a, 145b may be insulated by a gate insulating layer 125. The gate electrode 130 may be disposed between, and insulated from, the source contact plug 135 and the drain contact plug 140. A source S and a drain D may be formed on both ends of each of the channel regions 145a, 145b, at portions of the pair of fins.105a, 105b, respectively.

In at least one example embodiment of the present invention, the semiconductor device 100 may be referred to as a FinFET because channel regions 145a, 145b formed on the fins 105a, 105b may be used. However, semiconductor devices according to example embodiments of the present invention are not limited to the FinFET, but may be memory devices using the FinFET. For example, the memory device may include a random access memory (RAM), such as, a DRAM, PRAM, RRAM, FeRAM, a NOR-type flash memory or the like.

Referring to FIG. 1, the semiconductor substrate 110 may include the body 102, and a pair of fins 105a, 105b. The pair of fins 105a, 105b may be formed to protrude from the body 102 and be spaced from each other. For example, the fins 105a, 105b may be spaced from each other along the direction of X1, and may extend along the direction of X2. The semiconductor substrate 110 may be bulk silicon, bulk silicon-germanium, a complex structure including a silicon or silicon-germanium epitaxial layer thereon or the like. In at least one example embodiment, the fins 105a, 105b may be composed of the same or substantially the same material as that of the body 102, or may be an epitaxial layer formed on the body 102. In FIG. 1, for example, one pair of fins 105a, 105b is illustrated; however, a plurality of fins may be aligned along the direction of X1.

An isolation layer 115 may be filled between the pair of fins 105a, 105b. The isolation layer 115 may have a height (e.g., a given or desired height) on the body 102. For example, the isolation layer 115 may cover the lower portions of the inner sides of the fins 105a, 105b, whereas the upper portions of the fins 105a, 105b may be exposed. The external sides of the fins 105a, 105b may be surrounded and/or covered by an insulating layer 120. The insulating layer 120 may be a buried insulating layer, and for example purposes, will be referred to as such herein. The insulating layer 120 and the isolation layer 115 may function to isolate the fins 105a, 105b. The buried insulating layer 120 and the isolation layer 115 may include, for example, a silicon oxide layer having good insulation and/or filling properties. However, any suitable oxide may be used.

Based on the direction of X1, a stack structure (e.g., a silicon on insulator (SOI) structure) may be formed. The stack structure may include the buried insulating layer 120, one of the fins 105a, 105b and a gate electrode 130. Unlike related art SOI structures in which an active region may float from the body, the stack structure according to at least some example embodiments of the present invention may have fins 105a, 105b connected with the body 102 along the direction of X3. The structure of the semiconductor substrate 110 according to example embodiments of the present invention will be referred to as an SOI-like structure, and its characteristics will be explained throughout.

Referring to FIGS. 2A and 2B, the pair of channel regions 145a, 145b may be formed at least near the surfaces of the inner sides of the pair of fins 105a, 105b between the source S and the drain D. For example, the channel regions 145a, 145b may be formed on the upper portions of the inner sides of the fins 105a, 105b exposed by the isolation layer 115. The channel regions 145a, 145b may provide a conductive path for charges between the source S and the drain D.

Because the buried insulating layer 120 is buried on the external sides of the fins 105a, 105b, a channel may not be formed in the external sides of the fins 105a, 105b. In at least one example, the channel regions 145a, 145b may be formed on the upper surfaces of the fins 105a, 105b and/or the inner sides thereof (refer to FIG. 4B). However, the channel regions 145a, 145b formed on the inner sides of the fins 105a, 105b may serve as a main conductive path for charges.

The semiconductor device 100 may use a pair of the channel regions 145a, 145b formed on a pair of the fins 105a, 105b and corresponding to one gate electrode 130 as a conductive path for charges. Because the channel regions 145a, 145b may be used together, an operating current and/or operating speed of the semiconductor device 100 may be increased, and/or the semiconductor device 100 may be used for phase change memories (PRAMs), resistance memories (RRAMs) or the like, which may memory require higher operating current. Further, if the semiconductor device 100 is used in a DRAM, the DRAM may be provided with an increased sensing margin by the increased operation current.

By adjusting a height of the fins 105a, 105b and/or a height of the upper portions of the fins 105a, 105b exposed by the isolation layer 115, an area of the channel regions 145a, 145b may be adjusted. Therefore, an operating current and/or operating speed of the semiconductor device 100 may be increased (e.g., significantly increased) using the channel regions 145a, 145b formed on the fins 105a, 105b.

At least one pair of source S and drain D may be formed on the fins 105a, 105b. The source S and the drain D may be interchangeable in accordance with their functions. For example, the source S and the drain D may be spaced from each other along the direction, in which the fins 105a, 105b extend. As shown in FIG. 1, the source S and the drain D may be formed on portions of the fins 105a, 105b, for example, on the portions exposed by the isolation layer 115 based on the direction of X3. The respective sources S formed on the fins 105a, 105b may be disposed in opposition to each other, and in the same or substantially the same manner, the respective drains D formed on the fins 105a, 105b may be disposed in opposition to each other.

The source S and the drain D may create a diode-junction with the body 102 and/or the remaining portions of the fins 105a, 105b. For example, if the source S and the drain D are doped with n-type impurities, the remaining portions of the fins 105a, 105b and/or the body 102 may be doped with p-type impurities. Alternatively, the source S and the drain D may be doped with p-type impurities and the remaining portions of the fins 105a, 105b and/or the body 102 may be doped with n-type impurities.

The source contact plug 135 may electrically connect the sources S formed on the pair of fins 105a, 105b. For example, the source contact plug 135 may include a burial portion buried between the pair of fins 105a, 105b having the sources S formed therein. The drain contact plug 140 may electrically connect the drains D formed on the one pair of fins 105a, 105b. For example, the drain contact plug 140 may include a burial portion buried between the one pair of fins 105a, 105b having the drains D formed therein. The source contact plug 135 and the drain contact plug 140 may function to supply operation voltage and/or current to the source S and the drain D. The source contact plug 135 and the drain contact plug 140 may be composed of a conductive material, for example, doped polysilicon, a metal thin film, metal silicide, a combination layer thereof or the like.

The contact resistances of the source contact plug 135 and the source S, and the drain contact plug 140 and the drain D may be lower than those in the related art because the source contact plug 135 and the drain contact plug 140 may be concurrently connected to the portions of both inner sides of the fins 105a, 105b. A parasitic resistance such as the contact resistance may increase as integration density of the semiconductor device 100 is increased. Therefore, the source contact plug 135 and the drain contact plug 140 according to at least some example embodiments of the present invention may reduce parasitic resistance of the higher integrated semiconductor device 100 and/or improve an operating speed thereof.

The gate electrode 130 may include a burial portion buried between the channel regions 145a, 145b. The gate electrode 130 may be composed of polysilicon, metal, metal silicide, a combination layer thereof or the like. The gate electrode 130 may commonly correspond to the pair of channel regions 145a, 145b. Although the gate electrode 130 is shown as formed only between the fins 105a, 105b, a protruding portion may be formed across, over and or to cover the fins 105a, 105b (e.g., 130' of FIG. 4B). An insulating layer, for example, a silicon oxide layer or the like, may be interposed between the gate electrode 130, the source contact plug 135, and/or the drain contact plug 140.

Gate insulating layers 125 may be interposed between the gate electrode 130 and the channel regions 145a, 145b respectively. For example, the gate insulating layer 125 may be formed of a silicon oxide layer, a silicon nitride layer, a high-k dielectric layer, a combination layer thereof or the like. The gate insulating layer 125 may be formed to extend to the upper surfaces of the fins 105a, 105b (e.g., 125' of FIG. 4B).

Referring to FIGS. 1 and 2A, when a gate length W1 of the gate electrode 130 is about 1 F, a width W2 of each of the fins 105a, 105b may be about 0.25 F, a width (e.g., 2×W4) of the buried insulating layer 120 may be about 1 F, and a width W3 of the isolation layer 115 may be about 0.5 F. If the semiconductor devices 100 are aligned with an array of unit cells, the buried insulating layer 120 may be shared (e.g., equally shared) between adjacent cells. Thus, the buried insulating layer 120 may be disposed in one unit cell with a total width of about 1 F. If the semiconductor device 100 is used for a memory device, a length of one unit cell may be about 2 F based on a word line direction, for example, the direction of X1.

Operating characteristics of the memory device 100, according to at least some example embodiments of the present invention, will be explained in reference to FIGS. 1 and 2A through 2C. A turn-on voltage may be applied to the gate electrode 130, and the channel regions 145a, 145b may turn on concurrently and/or simultaneously to form a conductive path. An operating voltage may be applied between the source contact plug 135 and the drain contact plug 140, and between the source S and the drain D formed on the fins 105a, 105b such that a current flows from the drain D through the channel regions 145a, 145b to the source S and the semiconductor device performs one FinFET operation.

During the operation of the semiconductor device 100, a depletion region of the channel regions 145a, 145b, the source S and the drain D formed on the fins 105a, 105b may be limited. For example, as the widths of the fins 105a, 105b become thinner, the depletion region may be limited. In another example, the depletion region may be more limited along a width direction of the fins 105a, 105b, (e.g., the direction of X1), and may be formed just along the direction of X3. However, as the widths of the fins 105a, 105b are reduced, the influence of the depletion region formed along the direction of X3 may be decreased.

Therefore, although the fins 105a, 105b are connected to the body 102, the semiconductor substrate 110 may be formed into an SOI-like structure, and an off-current generated by extending the depletion region, a junction leakage current and/or a junction capacitance may be reduced. The reduction of the junction leakage current may improve a sensing margin of the semiconductor device 100, for example, a memory device, and/or may reduce power consumption. A short channel effect, which may become increasingly important as integration density of the semiconductor device 100 increases, may also be suppressed.

Applying a body-bias to the fins 105a, 105b by applying a voltage to the body 102 may be maintained, and a threshold voltage of the semiconductor device 100, for example, CMOS FinFET may be controlled more easily. For example, by controlling a body-bias of an NMOS FinFET and a PMOS FinFET, threshold voltages of two FinFETs may be controlled to have a similar or substantially similar value.

Figure 3:
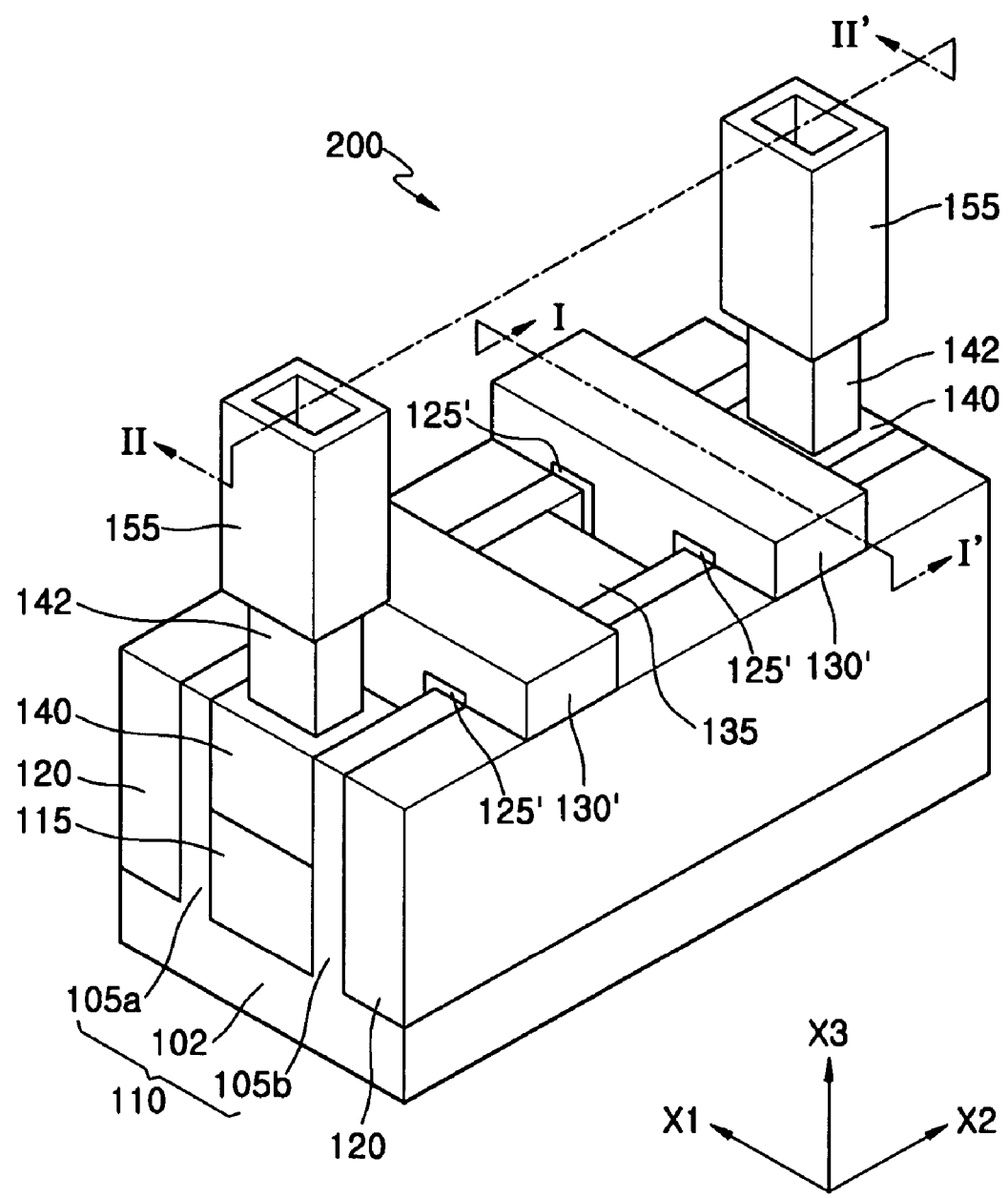
FIG. 3 is a perspective view illustrating a random access memory (RAM) according to an example embodiment of the present invention.
Figure 4A:
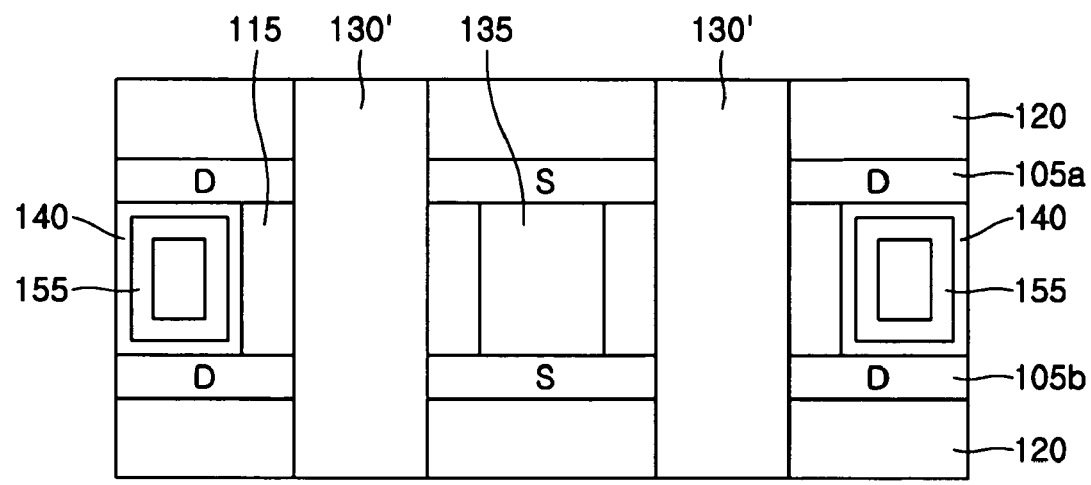
FIG. 4A is a plan view illustrating the RAM of FIG. 3.
Figure 4B:
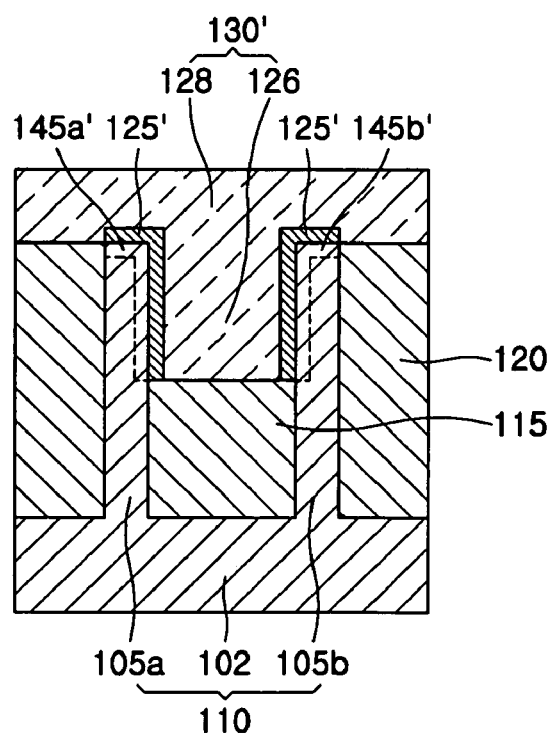
FIG. 4B is a sectional view taken along a line of I-I' of the RAM of FIG. 3.
Figure 4C:
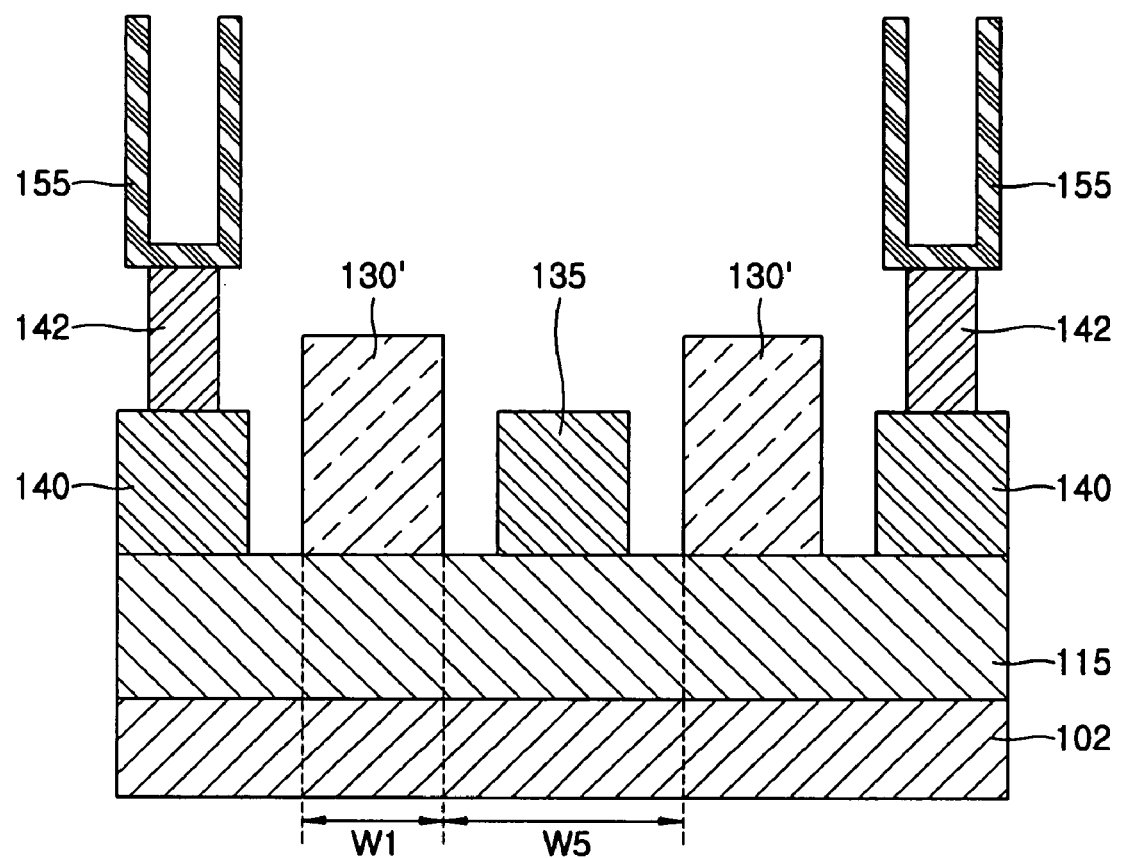
FIG. 4C is a sectional view taken along a line of II-II' of the RAM of FIG. 3.

The semiconductor device 100, according to at least some example embodiments of the present invention, may be used for a memory device, (e.g., a random access memory (RAM)). FIG. 3 is a perspective view illustrating a RAM 200 according to an example embodiment of the present invention, FIG. 4A is a plan view illustrating the RAM 200, FIG. 4B is a sectional view taken along a line of I-I' of the RAM 200 and FIG. 4C is a sectional view taken along a line of II-II' of the RAM 200. The RAM 200 may include at least one semiconductor device 100 (FIG. 1). Thus, for example purposes the RAM 200 may refer to the structure of FIGS. 1, and 2A through 2C. Like reference numerals in the drawings denote like elements or similar elements.

Referring to FIGS. 3 and 4A through 4C, the RAM 200 may be structured such that a pair of semiconductor devices 100 (FIG. 1) may be aligned in an array, and a source contact plug 135 may be shared. The RAM 200 may include a pair of storage nodes 155 on a pair of drain contact plugs 140. A pair of gate electrodes 130' may extend over a pair of fins 105a, 105b to form a word line. The RAM 200 may use a pair of FinFETs sharing a source S, and a pair of storage nodes 155 as a unit cell. The RAM 200 may include a plurality of the unit cells.

Referring to FIGS. 4A and 4B, channel regions 145a', 145b' may extend to the top portion of the fins 105a, 105b. A gate electrode 130' may extend over the fins 105a, 105b. For example, the gate electrode 130' may include a burial portion 126 and a protruding portion 128. A gate insulating layer 125' may extend over the fins 105a, 105b.

Referring to FIGS. 3 and 4C, the storage nodes 155 may be connected to the drain contact plugs 140, respectively, using buffer plugs 142. The buffer plug 142 and/or the drain contact plug 140 may be integrally formed without division. The storage node 155 may include a dielectric material, a variable resistance material, a phase change material, a ferroelectric material or the like. For example, in a DRAM, the storage node 155 may be a structure of a dielectric material surrounded by conductive layers, or in other words, a capacitor structure. In another example, in a PRAM the storage node 155 may be a phase change material, in an RRAM the storage node 155 may be a variable resistance material, and in a FeRAM the storage node 155 may be a ferroelectric material.

A gate length W1 of each of the gate electrodes 130' may be about 1 F, and a separation distance W5 of the two gate electrodes 130' may be about 2 F. A distance between two gate electrodes 130' with the drain contact plug 140 disposed between them may be about 2 F. However, a separation distance of the drain contact plugs 140 outwardly is not illustrated.

The RAM 200 forming a unit cell may have a length of about 8 F along the direction a bit line direction X2, and may have a unit cell area of about 2 F×about 8 F or 16 $F^2$. Alternatively, the RAM 200 may have a reduced unit cell area of 12 $F^2$. The RAM 200 according to example embodiments of the present invention may be formed more easily using a related art layout alignment.

Figure 5:
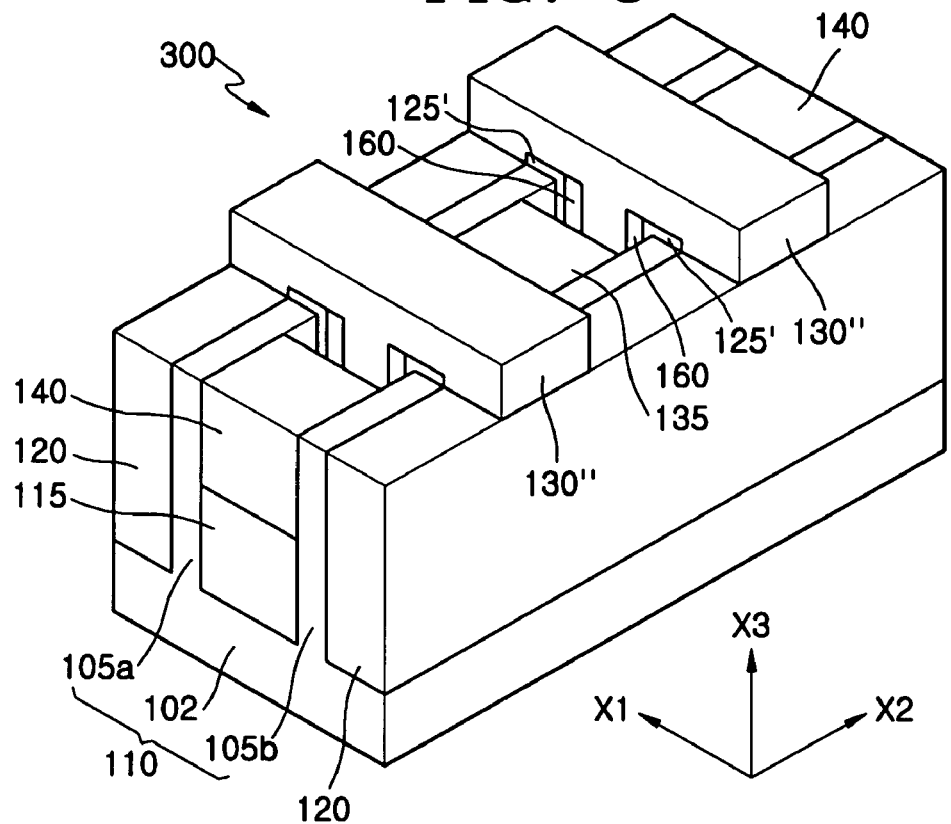
FIG. 5 is a perspective view illustrating a RAM according to another example embodiment of the present invention.
Figure 6:
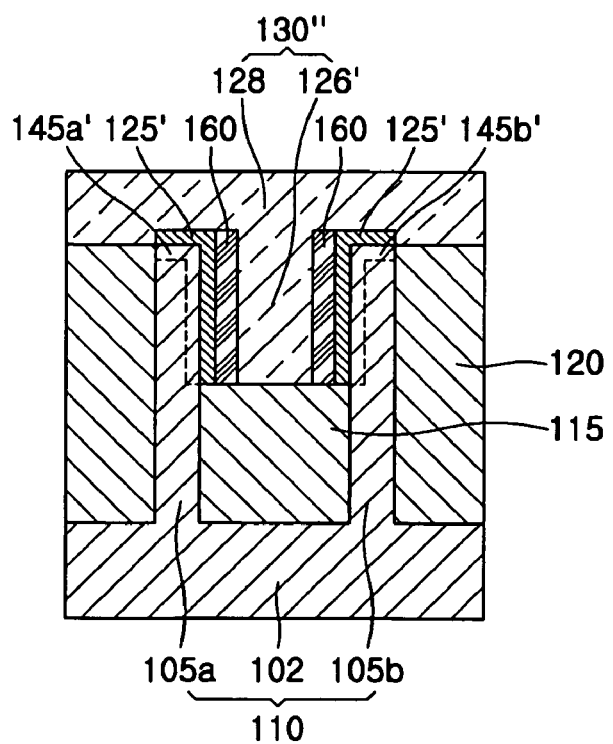
FIG. 6 is a plan view illustrating the RAM of FIG. 5.

FIG. 5 is a perspective view illustrating a RAM 300 according to another example embodiment of the present invention, and FIG. 6 is a plan view illustrating the RAM 300. The RAM 300 may be similar or substantially similar to the RAM 200, except that the RAM 300 may have a different placement of the storage node 160. For example purposes, the structure of the RAM 300 will be described with reference to FIGS. 1 through 4.

Referring to FIGS. 5 and 6, a storage node 160 may be interposed in at least a portion between a gate electrode 130" and a gate insulating layer 125'. For example, the storage node 160 may be interposed between a burial portion 126' of the gate electrode 130" and the gate insulating layer 125', and thus, may be formed vertically on an isolation layer 115.

The storage node 160 may include polysilicon, silicon-germanium, metal dot, silicon dot, a silicon nitride layer, a combination thereof or the like. For example, the silicon node 160 may be polysilicon, silicon-germanium, metal dot, silicon dot, a silicon nitride layer, combination thereof or the like, which may be surrounded by a silicon insulating layer. In this example, the RAM 300 may be a NOR-type flash memory, and the storage node 160 may function as a charge storage layer or a charge trap layer; however, the storage node 160 may be used in any suitable memory.

FIGS. 7 through 10 are perspective views illustrating a method of fabricating the semiconductor device 100 according to an example embodiment of the present invention. For example purposes, description of component elements may refer to FIGS. 1, and 2A through 2C.

Figure 7:
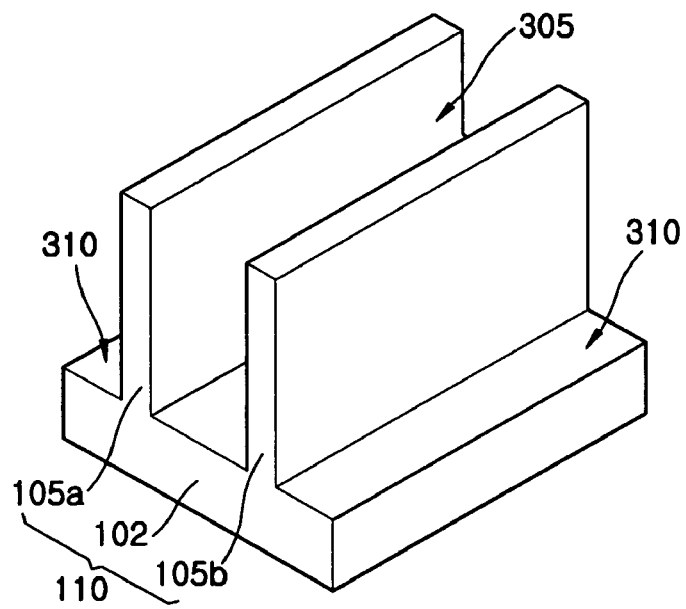
FIGS. 7 through 10 are perspective views illustrating a method of fabricating a semiconductor device according to an example embodiment of the present invention.

Referring to FIG. 7, a semiconductor substrate 110 may include at least one pair of fins 105a, 105b, defined by a first trench 305 and a second trench 310, and protruding from a body 102. The fins 105a, 105b may be formed using any method well-known to those skilled in this art. For example, the trenches 305, 310 may be formed using photolithography, etch technology, a combination thereof or the like.

Figure 8:
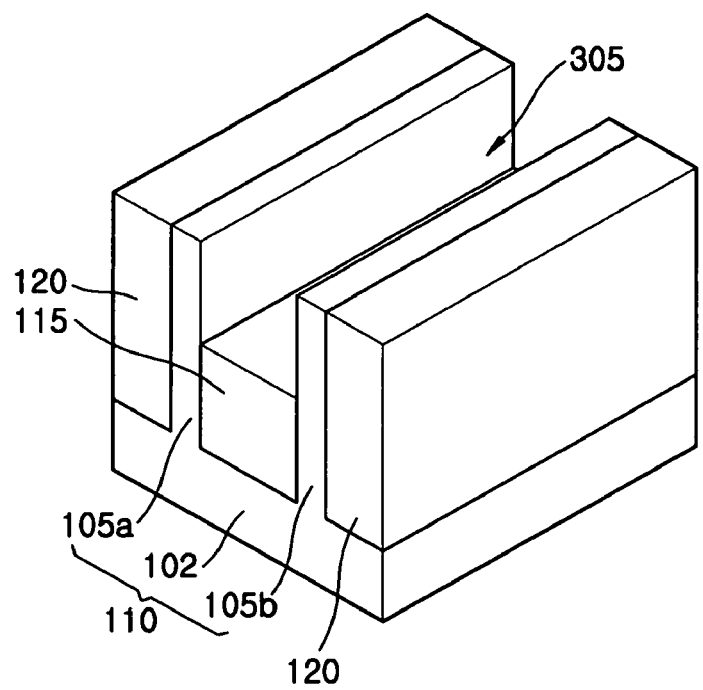

Referring to FIG. 8, a first insulating layer 120 may be formed to bury the first trench 305 and the second trench 310. For example, the first insulating layer 120 may be formed by forming a silicon oxide layer, or any suitable oxide layer, on the surface (e.g., the entire or overall surface) of the semiconductor substrate 110 to bury the trenches 305, 310. The silicon oxide layer may be planarized.

The buried insulating layer 120 may be selectively etched to a desired or given depth forming an isolation layer 115. For example, by protecting a portion of the first insulating layer 120 burying the second trench 310 with a photoresist pattern (not shown) and performing a dry-etch on the exposed portion of the first insulating layer 120 to a desired or given depth, the isolation layer 115 may be formed. The portion of the first insulating layer 120 burying the second trench 310 may be a buried insulating layer 120.

Figure 9:
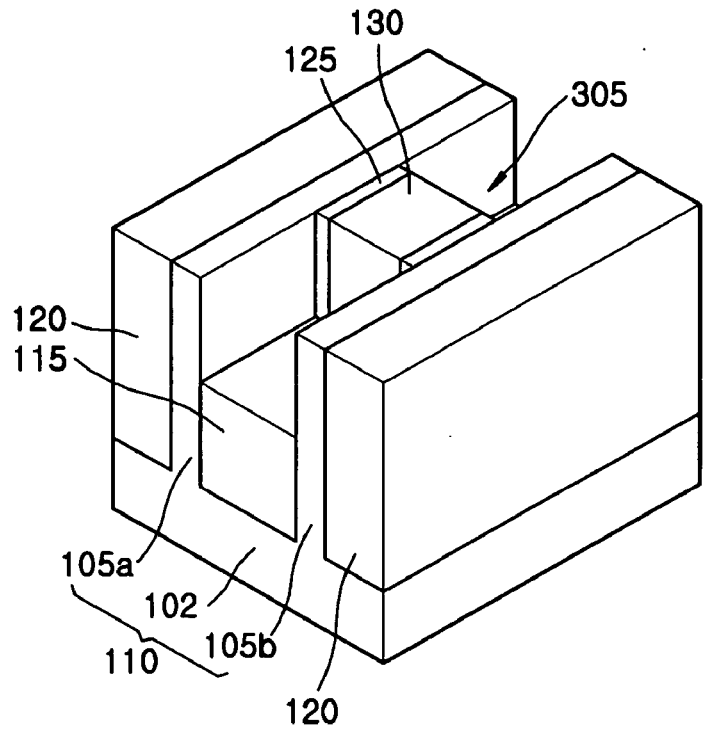

Referring to FIG. 9, a gate electrode 130 may be formed between the pair of fins 105a, 105b, and a gate insulating layer 125 may be interposed between the pair of fins 105a, 105b and the gate electrode 130. The gate electrode 130 may be insulated from the semiconductor substrate 110 by the gate insulating layer 125 and the isolation layer 115. For example, an oxide layer (not shown) may be formed on the inner sides of the exposed fins 105a, 105b, using a thermal oxidation method or the like, and a gate electrode layer (not shown) may be formed on the oxide layer. The oxide layer and the gate electrode layer may be patterned to form a gate insulating layer 125 and a gate electrode 130. Impurities may be implanted into the exposed upper surfaces and the inner sides of the fins 105a, 105b to form sources and drains (not shown).

Figure 10:
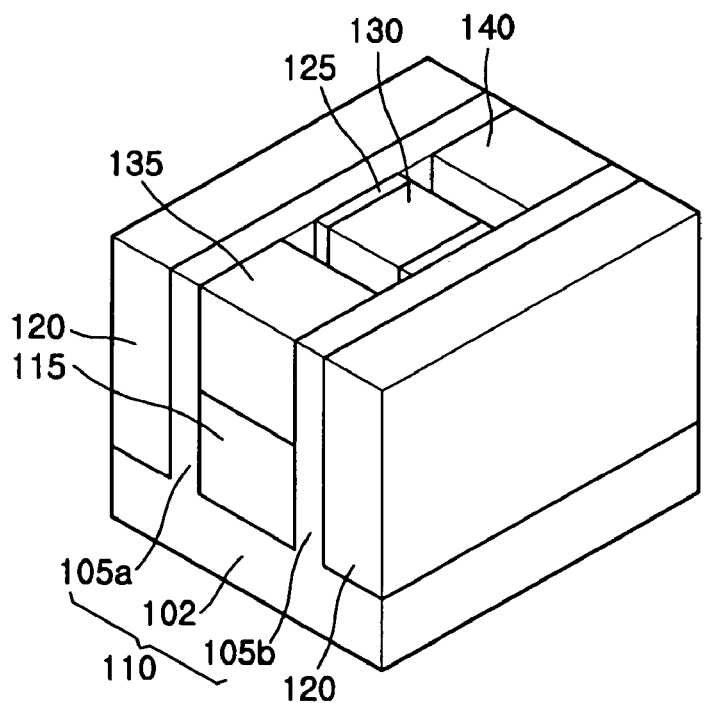

Referring to FIG. 10, a source contact plug 135 and a drain contact plug 140 may be formed to bury the first trench 305 (FIG. 9) on each side of the gate electrode 130. For example, by burying the first trench 305 with a conductive material to be isolated from the gate electrode 130, the source contact plug 135 and the drain contact plug 140 may be formed.

Example embodiments of the present invention have been described for the purpose of explanation. For example, a semiconductor device according to example embodiments of the present invention may include a FinFET and/or a memory device using the same. A RAM according to example embodiments of the present invention may include a NOR-type array structure in which the unit cells are aligned in an array.

While example embodiments of the present invention have been particularly shown and described with reference to the drawings, it will be understood by those of ordinary skill in the art that various changes in form and details may be made therein without departing from the spirit and scope of the present invention as defined by the following claims.

What is claimed is:

1. A semiconductor device comprising:
   a semiconductor substrate including a body and at least one pair of fins spaced from each other and protruding from the body;
   at least one source and at least one drain formed in each fin of the at least one pair of fins, within each fin, the at least one source being spaced apart from a corresponding drain along the direction in which the pair of fins extends;
   a channel region formed at least near the surfaces of an inner side of each fin, each channel region connecting a corresponding one of the at least one sources to a corresponding one of the at least one drains;

a gate electrode including a first portion arranged between the channel regions formed at least near the inner sides of each fin, and being insulated from the semiconductor substrate;
at least one source contact plug insulated from the body and electrically connected to the at least one sources on each fin concurrently; and
at least one drain contact plug insulated from the body and electrically connected to the at least one drains on each fin concurrently.

2. The semiconductor device according to claim 1, wherein the at least one source contact plug includes a first portion arranged between the at least one source on each fin, and the at least one drain contact plug includes a first portion arranged between the at least one drain on each fin.

3. The semiconductor device according to claim 1, wherein the gate electrode further includes a second portion protruding from between the channel regions, the second portion covering a top portion of the at least one pair of fins and being insulated from the fins.

4. The semiconductor device according to claim 1, further including,
a first insulating layer covering external sides of the at least one pair of fins.

5. The semiconductor device according to claim 4, further including,
a second insulating layer formed between the at least one source contact plug and the body, between the at least one drain contact plug and the body, and between each gate electrode and the body.

6. The semiconductor device according to claim 1, further including,
a storage node arranged between the first portion of the gate electrode and each channel region, the storage node being insulated from the gate electrode and each channel region.

7. The semiconductor device according to claim 6, wherein the storage node includes polysilicon, silicon-germanium, metal dot, silicon dot or a silicon nitride layer.

8. The semiconductor device according to claim 1, further including,
a storage node formed on the at least one drain contact plug or the at least one source contact plug.

9. The semiconductor device according to claim 8, wherein the storage node includes a dielectric material, a variable resistance material, a phase change material or a ferroelectric material.

10. A random access memory device comprising:
at least one unit cell, each of the at least one unit cell including,
at least two of the semiconductor devices claimed in claim 1 sharing a common source, and
a storage node interposed between the first portion of each gate electrode corresponding channel region, the storage node being insulated from each gate electrodes and channel region.

11. The random access memory device according to claim 10, wherein each source contact plug includes a first portion formed between the at least one sources formed on each respective fin, and each of the at least one drain contact plug includes a first portion formed between each set of corresponding drains formed in each respective fin.

12. The random access memory device according to claim 10, wherein each of the at least two semiconductor devices further includes,
a first insulating layer covering external sides of the at least one pair of fins.

13. The random access memory device according to claim 12, wherein each of the at least two semiconductor devices further includes,
a second insulating layer formed between the at least one source contact plug and the body, between the at least one drain contact plugs and the body, and between each gate electrode and the body.

14. The random access memory device according to claim 10, wherein the gate electrode in each of the at least two semiconductor devices further includes,
a second portion connected to the first portion, the second portion covering a top portion of the at least one pair of fins and being insulated from the fins.

15. The random access memory device according to claim 10, wherein the storage node includes polysilicon, silicon-germanium, metal dot, silicon dot or a silicon nitride layer.

16. A random access memory device comprising:
at least one unit cell, each of the at least one unit cell including,
at least two of the semiconductor devices claimed in claim 1 sharing a common source, and
a storage node formed on each of the at least one drain contact plug.

17. The random access memory device according to claim 16, wherein each source contact plug includes a first portion formed between each set of corresponding sources on each respective fin, and each of the at least one drain contact plug includes a first portion formed between the each set of corresponding drains formed each respective fin.

18. The random access memory device according to claim 16, wherein each of the at least two semiconductor devices further includes,
a first insulating layer covering external sides of the at least one pair of fins.

19. The random access memory device according to claim 18, each of the at least two semiconductor devices further includes,
a second insulating layer formed between the at least one source contact plug and the body, between the at least two drain contact plugs and the body, and between each gate electrode and the body.

20. The random access memory device according to claim 16, wherein the gate electrode in each of the at least two semiconductor devices further includes,
a second portion connected to the first portion, the second portion covering a top portion of the at least one pair of fins and being insulated from the fins.

21. The random access memory device according to claim 16, wherein the storage node includes a dielectric material, a variable resistance material, a phase change material or a ferroelectric material.

* * * * *